(12) United States Patent
Lee

(10) Patent No.: US 11,062,764 B1
(45) Date of Patent: Jul. 13, 2021

(54) SEMICONDUCTOR DEVICES

(71) Applicant: SK hynix Inc., Icheon-si (KR)

(72) Inventor: Kwang Hun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/912,350

(22) Filed: Jun. 25, 2020

(30) Foreign Application Priority Data

Feb. 17, 2020 (KR) .......................... 10-2020-0019319

(51) Int. Cl.
*G11C 7/00* (2006.01)
*G11C 11/4096* (2006.01)
*G11C 11/4093* (2006.01)

(52) U.S. Cl.
CPC ...... *G11C 11/4096* (2013.01); *G11C 11/4093* (2013.01)

(58) Field of Classification Search
CPC .......................... G11C 11/4096; G11C 11/4093
USPC ..................................... 365/189.14
See application file for complete search history.

(56) References Cited

U.S. PATENT DOCUMENTS

| 2004/0065904 | A1* | 4/2004 | Yoshida | G11C 7/1006 257/200 |
| 2011/0271063 | A1* | 11/2011 | Kwak | G06F 13/4072 711/154 |
| 2015/0095520 | A1* | 4/2015 | Kwack | G11C 7/1006 710/14 |

FOREIGN PATENT DOCUMENTS

KR   1020180106127 A   10/2018

* cited by examiner

*Primary Examiner* — Vu A Le
(74) *Attorney, Agent, or Firm* — William Park & Associates Ltd.

(57) ABSTRACT

A semiconductor device includes a control signal generation circuit and an input/output control circuit. The control signal generation circuit enters a copy operation based on a combination of logic levels of first and second operation control signals and generates a transfer control signal according to a detection result of logic levels of bits included in first internal data during the copy operation. The input/output control circuit generates first data and second data by inverting or non-inverting the logic levels of the first internal data based on the transfer control signal.

20 Claims, 15 Drawing Sheets

FIG. 3

| COPY | DBI | HG.CON ◊ | LW.CON ◊ | BL.CON ◊ | TCON ◊ | OPERATION |
|---|---|---|---|---|---|---|
| H | L | Don't care | Don't care | Don't care | L | NO INVERSION |
| H | L | Don't care | Don't care | Don't care | H | INVERSION |
| H | H | H | L | H | L | NO INVERSION |
| H | H | L | H | H | H | INVERSION |
| H | H | L | L | L | L | NO INVERSION |
| H | H | L | L | L | H | INVERSION |

COPY

| | <1> | <2> | <3> | <4> | <5> | <6> | <7> | <8> |
|---|---|---|---|---|---|---|---|---|
| ID1 | 1 | 0 | 1 | 0 | 1 | 0 | 1 | 0 |
| DATA1 | 1 | 0 | 1 | 0 | 1 | 0 | 1 | 0 |
| DATA2 | 1 | 0 | 1 | 0 | 1 | 0 | 1 | 0 |
| DATA3 | 1 | 0 | 1 | 0 | 1 | 0 | 1 | 0 |
| DATA4 | 1 | 0 | 1 | 0 | 1 | 0 | 1 | 0 |
| DATA5 | 1 | 0 | 1 | 0 | 1 | 0 | 1 | 0 |
| DATA6 | 1 | 0 | 1 | 0 | 1 | 0 | 1 | 0 |
| DATA7 | 1 | 0 | 1 | 0 | 1 | 0 | 1 | 0 |
| DATA8 | 1 | 0 | 1 | 0 | 1 | 0 | 1 | 0 |

COPY with DB1

| | <1> | <2> | <3> | <4> | <5> | <6> | <7> | <8> |
|---|---|---|---|---|---|---|---|---|
| ID1 | 1 | 0 | 1 | 0 | 1 | 0 | 1 | 0 |
| DATA1 | 0 | 1 | 0 | 1 | 0 | 1 | 0 | 1 |
| DATA2 | 0 | 1 | 0 | 1 | 0 | 1 | 0 | 1 |
| DATA3 | 0 | 1 | 0 | 1 | 0 | 1 | 0 | 1 |
| DATA4 | 0 | 1 | 0 | 1 | 0 | 1 | 0 | 1 |
| DATA5 | 0 | 1 | 0 | 1 | 0 | 1 | 0 | 1 |
| DATA6 | 0 | 1 | 0 | 1 | 0 | 1 | 0 | 1 |
| DATA7 | 0 | 1 | 0 | 1 | 0 | 1 | 0 | 1 |
| DATA8 | 0 | 1 | 0 | 1 | 0 | 1 | 0 | 1 |

COPY with DB2

| | <1> | <2> | <3> | <4> | <5> | <6> | <7> | <8> |
|---|---|---|---|---|---|---|---|---|
| ID1 | 1 | 0 | 1 | 0 | 1 | 0 | 1 | 0 |
| DATA1 | 0 | 0 | 0 | 0 | 0 | 0 | 0 | 0 |
| DATA2 | 0 | 0 | 0 | 0 | 0 | 0 | 0 | 0 |
| DATA3 | 0 | 0 | 0 | 0 | 0 | 0 | 0 | 0 |
| DATA4 | 0 | 0 | 0 | 0 | 0 | 0 | 0 | 0 |
| DATA5 | 0 | 0 | 0 | 0 | 0 | 0 | 0 | 0 |
| DATA6 | 0 | 0 | 0 | 0 | 0 | 0 | 0 | 0 |
| DATA7 | 0 | 0 | 0 | 0 | 0 | 0 | 0 | 0 |
| DATA8 | 0 | 0 | 0 | 0 | 0 | 0 | 0 | 0 |

COPY with DB3

| | <1> | <2> | <3> | <4> | <5> | <6> | <7> | <8> |
|---|---|---|---|---|---|---|---|---|
| ID1 | 1 | 0 | 1 | 0 | 1 | 0 | 1 | 0 |
| DATA1 | 0 | 0 | 1 | 0 | 1 | 0 | 1 | 0 |
| DATA2 | 0 | 0 | 1 | 0 | 1 | 0 | 1 | 0 |
| DATA3 | 0 | 0 | 1 | 0 | 1 | 0 | 1 | 0 |
| DATA4 | 0 | 0 | 1 | 0 | 1 | 0 | 1 | 0 |
| DATA5 | 0 | 0 | 1 | 0 | 1 | 0 | 1 | 0 |
| DATA6 | 0 | 0 | 1 | 0 | 1 | 0 | 1 | 0 |
| DATA7 | 0 | 0 | 1 | 0 | 1 | 0 | 1 | 0 |
| DATA8 | 0 | 0 | 1 | 0 | 1 | 0 | 1 | 0 |

SEMICONDUCTOR DEVICES

CROSS-REFERENCE TO RELATED APPLICATIONS

The present application claims priority under 35 U.S.C 119(a) to Korean Patent Application No. 10-2020-0019319, filed on Feb. 17, 2020, which is incorporated herein by reference in its entirety.

BACKGROUND

1. Technical Field

Embodiments of the present disclosure generally relate to semiconductor devices, and more particularly, to semiconductor devices configured to perform a copy operation for data.

2. Related Art

Semiconductor devices such as DRAM devices perform a write operation and a read operation. The write operation is performed to store data into a bank including cell arrays selected by an address, and the read operation is performed to output the data stored in the cell arrays included in the bank. In addition, the semiconductor devices are designed to internally copy data having various patterns and to perform various tests using the copied data.

SUMMARY

According to an embodiment, a semiconductor device may include a control signal generation circuit and an input/output control circuit. The control signal generation circuit may be configured to enter a copy operation based on a combination of logic levels of first and second operation control signals and may be configured to generate a transfer control signal according to a detection result of logic levels of bits included in first internal data during the copy operation. The input/output control circuit may be configured to generate first data and second data by inverting or non-inverting the logic levels of the first internal data based on the transfer control signal.

According to another embodiment, a semiconductor device may include a control signal generation circuit, a core circuit, and an input/output control circuit. The control signal generation circuit may be configured to generate a transfer control signal according to a detection result of logic levels of bits included in first internal data and first data during a copy operation. The core circuit may be configured to output the first internal data stored therein based on a read command and an address during a read operation and may be configured to store the first internal data and second internal data based on a write command and the address during a write operation. The input/output control circuit may be configured to invert or non-invert logic levels of the first internal data based on the transfer control signal to generate the first data and second data during the read operation and may be configured to invert or non-invert logic levels of the first data based on the transfer control signal during the write operation to generate the first internal data and the second internal data during the write operation.

BRIEF DESCRIPTION OF THE DRAWINGS

FIG. 3 is a table illustrating logic levels of signals for performing a copy operation and a data inversion operation of a semiconductor device according to an embodiment of the present disclosure.

FIGS. 13 and 14 are schematic diagrams illustrating a copy operation and a data inversion operation of a semiconductor device according to an embodiment of the present disclosure.

DETAILED DESCRIPTION

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter with reference to the accompanying drawings. However, the embodiments described herein are for illustrative purposes only and are not intended to limit the scope of the present disclosure.

Figure 1:
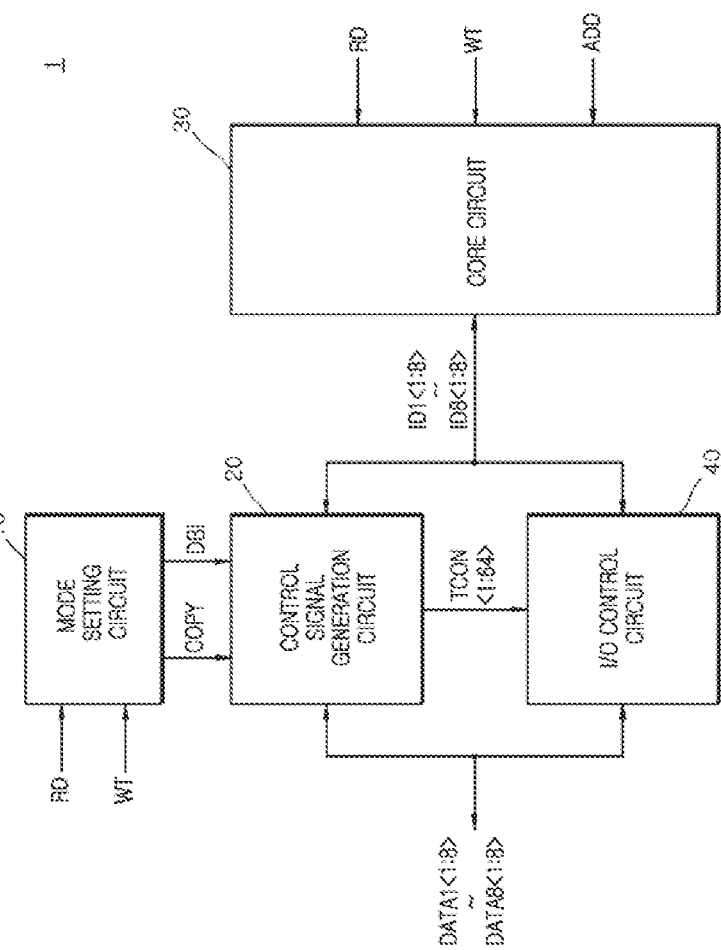
FIG. 1 is a block diagram illustrating a configuration of a semiconductor device according to an embodiment of the present disclosure.

As illustrated in FIG. 1, a semiconductor device 1 according to an embodiment of the present disclosure may include a mode setting circuit 10, a control signal generation circuit 20, a core circuit 30, and an I/O control circuit 40.

The mode setting circuit 10 may receive a read command RD to generate a first operation control signal COPY and a second operation control signal DBI. The mode setting circuit 10 may receive a write command WT to generate the first operation control signal COPY and the second operation control signal DBI. When any one of the read command RD and the write command WT is enabled, the mode setting circuit 10 may generate the first operation control signal COPY and the second operation control signal DBI having a predetermined logic level. The first operation control signal COPY may be set as a signal that is enabled to enter a copy operation. The second operation control signal DBI may be set as a signal that is enabled for a data inversion operation to invert logic levels of first to eighth data DATA1<1:8> to DATA8<1:8> and first to eighth internal data ID1<1:8> to ID8<1:8> during the copy operation. The mode setting circuit 10 may be realized using a register to output the first operation control signal COPY and the second operation control signal DBI which are stored in the register. The copy operation may be set as an operation of copying the first internal data ID1<1:8> to generate the first to eighth data DATA1<1:8> to DATA8<1:8> during a read operation. The copy operation may be set as an operation of copying the first data DATA1<1:8> to generate the first to eighth internal data ID1<1:8> to ID8<1:8> during a write operation. During the read operation of the copy operation, bits of the first data DATA1<1:8> may be generated to have the same logic levels as bits of the first internal data ID1<1:8>. During the read operation of the copy operation, bits of the second to eighth data DATA2<1:8> to DATA8<1:8> may be generated by inverting or non-inverting the logic levels of the bits of the first internal data ID1<1:8>. During the write operation of the copy operation, the bits of the first internal data ID1<1:8> may be generated to have the same logic levels as the bits of the first data DATA1<1:8>. During the write operation of the copy operation, bits of the second to eighth internal data ID2<1:8> to ID8<1:8> may be generated by inverting or non-inverting the logic levels of the bits of the first data DATA1<1:8>. The logic levels of the first operation control signal COPY and the second operation control signal DBI for the copy operation and the data inversion operation will be described with reference to FIG. 3 later.

The control signal generation circuit 20 may enter the copy operation based on a combination of logic levels of the first operation control signal COPY and the second operation control signal DBI. During the read operation of the copy operation, the control signal generation circuit 20 may generate a transfer control signal TCON<1:64> according to a result of detecting logic levels of bits included in the first internal data ID1<1:8>. During the write operation of the copy operation, the control signal generation circuit 20 may generate the transfer control signal TCON<1:64> according to a result of detecting logic levels of bits included in the first data DATA1<1:8>. The transfer control signal TCON<1:64> may be generated such that the number of bits of the transfer control signal TCON<1:64> is equal to the number of bits of the first to eighth data DATA1<1:8> to DATA8<1:8>. The transfer control signal TCON<1:64> may be generated such that the number of bits of the transfer control signal TCON<1:64> is equal to the number of bits of the first to eighth internal data ID1<1:8> to ID8<1:8>.

When the read command RD is enabled during the copy operation, the core circuit 30 may output the first internal data ID1<1:8> stored in memory cells (not illustrated) selected by an address ADD. When the write command WT is enabled during the copy operation, the core circuit 30 may store the first to eighth internal data ID1<1:8> to ID8<1:8> in memory cells (not illustrated) selected by the address ADD.

During the read operation, the input/output (I/O) control circuit 40 may invert or non-invert the logic levels of the first internal data ID1<1:8> based on the transfer control signal TCON<1:64> to generate the first to eighth data DATA1<1:8> to DATA8<1:8>. During the write operation, the I/O control circuit 40 may invert or non-invert the logic levels of the first data DATA1<1:8> based on the transfer control signal TCON<1:64> to generate the first to eighth internal data ID1<1:8> to ID8<1:8>. As used in the figures, the tilde "~" indicates a range of components. For example, "DATA1<1:8>~DATA8<1:8>" indicates the first to eighth data DATA1<1:8> to DATA8<1:8> discussed in the figures' related description.

Figure 2:
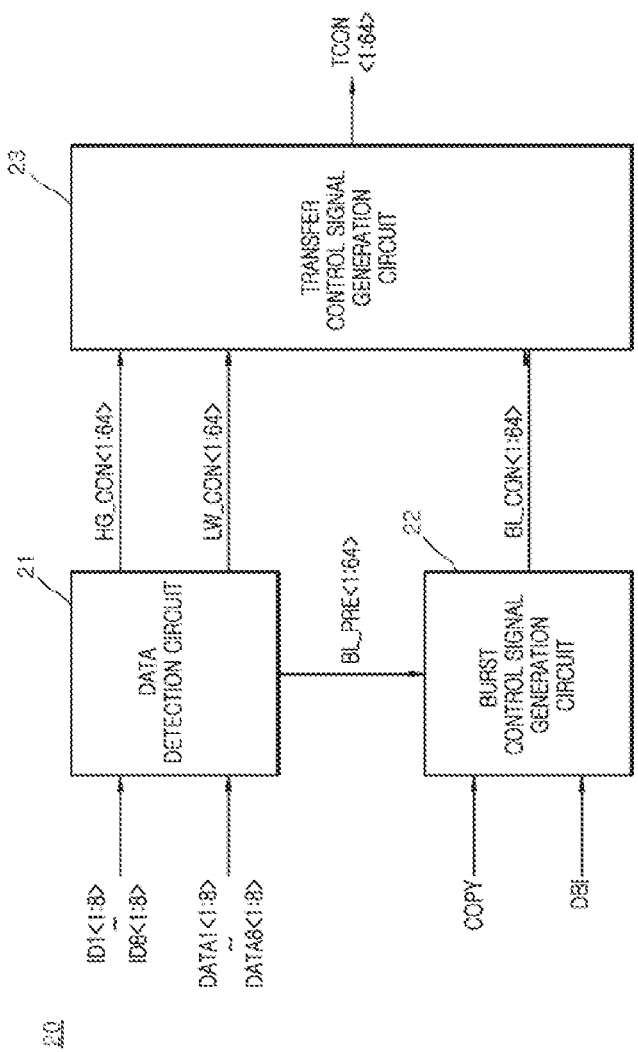
FIG. 2 is a block diagram illustrating a configuration of a control signal generation circuit included in the semiconductor device illustrated in FIG. 1.

FIG. 2 is a block diagram illustrating a configuration of an example of the control signal generation circuit 20. As illustrated in FIG. 2, the control signal generation circuit 20 may include a data detection circuit 21, a burst control signal generation circuit 22, and a transfer control signal generation circuit 23.

During the read operation, the data detection circuit 21 may detect logic levels of the bits included in the first internal data ID1<1:8> to generate an up-control signal HG_CON<1:64>, a down-control signal LW_CON<1:64>, and a pre-burst control signal BL_PRE<1:64>. During the write operation, the data detection circuit 21 may detect logic levels of the bits included in the first data DATA1<1:8> to generate the up-control signal HG_CON<1:64>, the down-control signal LW_CON<1:64>, and the pre-burst control signal BL_PRE<1:64>.

The burst control signal generation circuit 22 may generate a burst control signal BL_CON<1:64> from the pre-burst control signal BL_PRE<1:64> based on a combination of logic levels of the first operation control signal COPY and the second operation control signal DBI.

The transfer control signal generation circuit 23 may generate the transfer control signal TCON<1:64> according to logic levels of the up-control signal HG_CON<1:64>, the down-control signal LW_CON<1:64>, and the burst control signal BL_CON<1:64>.

Referring to FIG. 3, the logic levels of the first operation control signal COPY and the second operation control signal DBI for performing the copy operation and the data inversion operation according to an embodiment of the present disclosure will be described hereinafter.

The copy operation may be performed when the first operation control signal COPY has a logic "high" level and the second operation control signal DBI has a logic "low" level.

When the first operation control signal COPY has a logic "high" level and the second operation control signal DBI has a logic "high" level, the data inversion operation might or might not be performed during the copy operation.

Referring to FIG. 3, logic levels of the transfer control signal generated by the up-control signal, the down-control signal, and the burst control signal during the data inversion operation of the copy operation according to an embodiment of the present disclosure will be described hereinafter. In addition, an operation for inverting and non-inverting the first internal data and the first data according to the logic levels of the transfer control signal will be described hereinafter.

Prior to the description, the bit number "i" in FIG. 3 may be set to any one of the first to $64^{th}$ bits.

First, when the copy operation is performed, the up-control signal HG_CON<i>, the down-control signal LW_CON<i>, and the burst control signal BL_CON<i> may be processed as "don't care". When the copy operation is performed, the transfer control signal TCON<i> may be generated to have a logic "low" level or a logic "high" level.

When the transfer control signal TCON<i> is generated to have a logic "low" level, the first internal data ID1<1:8> may be non-inverted to generate the first to eighth data DATA1<1:8> to DATA8<1:8>. When the transfer control signal TCON<i> is generated to have a logic "low" level, the first data DATA1<1:8> may be non-inverted to generate the first to eighth internal data ID1<1:8> to ID8<1:8>.

When the transfer control signal TCON<i> is generated to have a logic "high" level, the first internal data ID1<1:8> may be inverted to generate the first to eighth data DATA1<1:8> to DATA8<1:8>. When the transfer control signal TCON<i> is generated to have a logic "high" level, the first data DATA1<1:8> may be inverted to generate the first to eighth internal data ID1<1:8> to ID8<1:8>.

Next, when the data inversion operation is performed during the copy operation, the transfer control signal TCON<i> may be generated to have a logic "low" level if the up-control signal HG_CON<i> has a logic "high" level, the down-control signal LW_CON<i> has a logic "low" level, and the burst control signal BL_CON<i> has a logic "high" level.

When the transfer control signal TCON<i> is generated to have a logic "low" level, the first internal data ID1<1:8> may be non-inverted to generate the first to eighth data DATA1<1:8> to DATA8<1:8>. When the transfer control signal TCON<i> is generated to have a logic "low" level, the first data DATA1<1:8> may be non-inverted to generate the first to eighth internal data ID1<1:8> to ID8<1:8>.

Next, when the data inversion operation is performed during the copy operation, the transfer control signal TCON<i> may be generated to have a logic "high" level if the up-control signal HG_CON<i> has a logic "low" level, the down-control signal LW_CON<i> has a logic "high" level, and the burst control signal BL_CON<i> has a logic "high" level.

When the transfer control signal TCON<i> is generated to have a logic "high" level, the first internal data ID1<1:8> may be inverted to generate the first to eighth data DATA1<1:8> to DATA8<1:8>. When the transfer control signal TCON<i> is generated to have a logic "low" level, the first data DATA1<1:8> may be inverted to generate the first to eighth internal data ID1<1:8> to ID8<1:8>.

Next, when the data inversion operation is performed during the copy operation, the transfer control signal TCON<i> may be generated to have a logic "low" level or a logic "high" level if the up-control signal HG_CON<i> has a logic "low" level, the down-control signal LW_CON<i> has a logic "low" level, and the burst control signal BL_CON<i> has a logic "low" level.

When the transfer control signal TCON<i> is generated to have a logic "low" level, the first internal data ID1<1:8> may be non-inverted to generate the first to eighth data DATA1<1:8.> to DATA8<1:8>. When the transfer control signal TCON<i> is generated to have a logic "low" level, the first data DATA1<1:8> may be non-inverted to generate the first to eighth internal data ID1<1:8> to ID8<1:8>.

When the transfer control signal TCON<i> is generated to have a logic "high" level, the first internal data ID1<1:8> may be inverted to generate the first to eighth data DATA1<1:8> to DATA8<1:8>. When the transfer control signal TCON<i> is generated to have a logic "high" level, the first data DATA1<1:8> may be inverted to generate the first to eighth internal data ID1<1:8> to ID8<1:8>.

Figure 4:
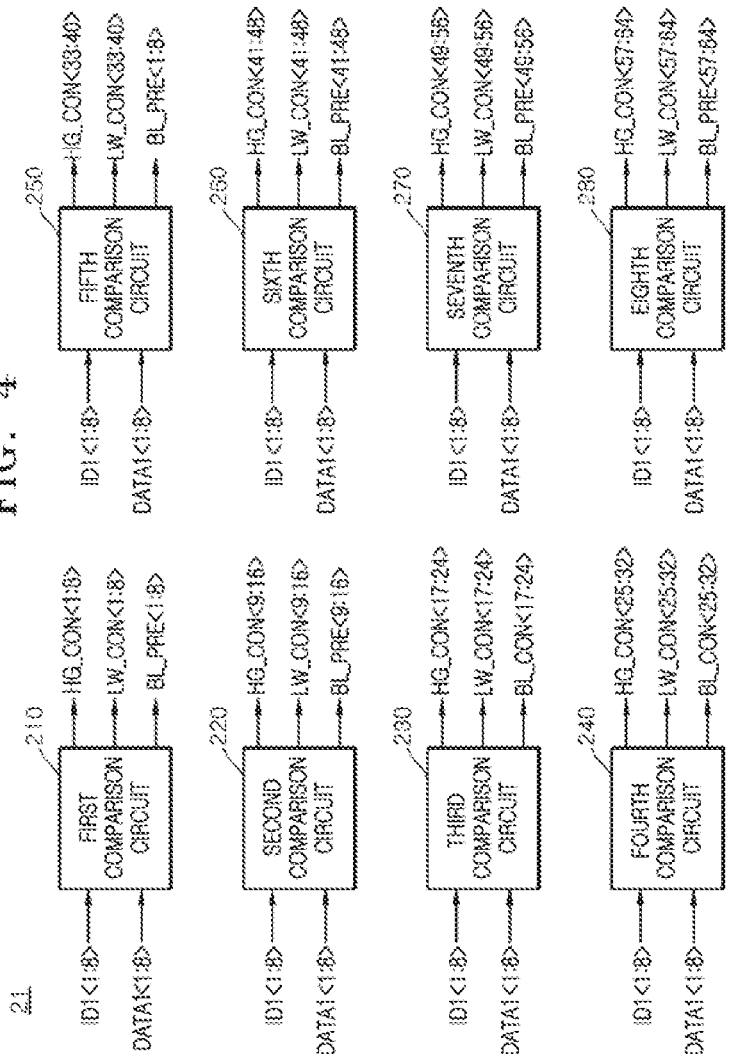
FIG. 4 is a block diagram illustrating a configuration of a data detection circuit included in the control signal generation circuit illustrated in FIG. 2.

FIG. 4 is a block diagram illustrating a configuration of an example of the data detection circuit 21. As illustrated in FIG. 4, the data detection circuit 21 may include a first comparison circuit 210, a second comparison circuit 220, a third comparison circuit 230, a fourth comparison circuit 240, a fifth comparison circuit 250, a sixth comparison circuit 260, a seventh comparison circuit 270, and an eighth comparison circuit 280.

During the read operation, the first comparison circuit 210 may compare logic levels of bits included in the first internal data ID1<1:8> with each other to generate first to eighth bit signals HG_CON<1:8> of the up-control signal, first to eighth bit signals LW_CON<1:8> of the down-control signal bits, and first to eighth bit signals BL_PRE<1:8> of the pre-burst control signal. During the write operation, the first comparison circuit 210 may compare logic levels of bits included in the first data DATA1<1:8> to generate the first to eighth bit signals HG_CON<1:8> of the up-control signal, the first to eighth bit signals LW_CON<1:8> of the down-control signal, and the first to eighth bit signals BL_PRE<1:8> of the pre-burst control signal. When all of the bits included in the first internal data ID1<1:8> have a logic "high" level during the read operation, the first comparison circuit 210 may generate the first to eighth bit signals HG_CON<1:8> of the up-control signal which are enabled. When all of the bits included in the first internal data ID1<1:8> have a logic "low" level during the read operation, the first comparison circuit 210 may generate the first to eighth bit signals LW_CON<1:8> of the down-control signal which are enabled. When all of the bits included in the first internal data ID1<1:8> do not have the same logic level during the read operation, the first comparison circuit 210 may generate the first to eighth bit signals BL_PRE<1:8> of the pre-burst control signal which are enabled. When all of the bits included in the first data DATA1<1:8> have a logic "high" level during the write operation, the first comparison circuit 210 may generate the first to eighth bit signals HG_CON<1:8> of the up-control signal which are enabled. When all of the bits included in the first data DATA1<1:8> have a logic "low" level during the write operation, the first comparison circuit 210 may generate the first to eighth bit signals LW_CON<1:8> of the down-control signal which are enabled. When all of the bits included in the first data DATA1<1:8> do not have the same logic level during the write operation, the first comparison circuit 210 may generate the first to eighth bit signals BL_PRE<1:8> of the pre-burst control signal which are enabled.

During the read operation, the second comparison circuit 220 may compare the logic levels of the bits included in the first internal data ID1<1:8> to generate ninth to $16^{th}$ bit signals HG_CON<9:16> of the up-control signal, ninth to $16^{th}$ bit signals LW_CON<9:16> of the down-control signal, and ninth to $16^{th}$ bit signals BL_PRE<9:16> of the pre-burst control signal. During the write operation, the second comparison circuit 220 may compare the logic levels of the bits included in the first data DATA1<1:8> to generate the ninth to $16^{th}$ bit signals HG_CON<9:16> of the up-control signal, the ninth to $16^{th}$ bit signals LW_CON<9:16> of the down-control signal, and the ninth to $16^{th}$ bit signals BL_PRE<9:16> of the pre-burst control signal. When all of the bits included in the first internal data ID1<1:8> have a logic "high" level during the read operation, the second comparison circuit 220 may generate the ninth to $16^{th}$ bit signals HG_CON<9:16> of the up-control signal which are enabled. When all of the bits included in the first internal data ID1<1:8> have a logic "low" level during the read operation, the second comparison circuit 220 may generate the ninth to $16^{th}$ bit signals LW_CON<9:16> of the down-control signal which are enabled. When all of the bits included in the first internal data ID1<1:8> do not have the same logic level during the read operation, the second comparison circuit 220 may generate the ninth to $16^{th}$ bit signals BL_PRE<9:16> of the pre-burst control signal which are enabled. When all of the bits included in the first data DATA1<1:8> have a logic "high" level during the write operation, the second comparison circuit 220 may generate the ninth to $16^{th}$ bit signals HG_CON<9:16> of the up-control signal which are enabled. When all of the bits included in the first data DATA1<1:8> have a logic "low" level during the write operation, the second comparison circuit 220 may generate the ninth to $16^{th}$ bit signals LW_CON<9:16> of the down-control signal which are enabled. When all of the bits included in the first data DATA1<1:8> do not have the same logic level during the write operation, the second comparison circuit 220 may generate the ninth to $16^{th}$ bit signals BL_PRE<9:16> of the pre-burst control signal which are enabled.

During the read operation, the third comparison circuit 230 may compare the logic levels of the bits included in the first internal data ID1<1:8> to generate $17^{th}$ to $24^{th}$ bit signals HG_CON<17:24> of the up-control signal, $17^{th}$ to $24^{th}$ bit signals LW_CON<17:24> of the down-control signal, and $17^{th}$ to $24^{th}$ bit signals BL_PRE<17:24> of the pre-burst control signal. During the write operation, the third comparison circuit 230 may compare the logic levels of the bits included in the first data DATA1<1:8> to generate the $17^{th}$ to $24^{th}$ bit signals HG_CON<17:24> of the up-control signal, the $17^{th}$ to $24^{th}$ bit signals LW_CON<17:24> of the down-control signal, and the $17^{th}$ to $24^{th}$ bit signals BL_PRE<17:24> of the pre-burst control signal. When all of the bits included in the first internal data ID1<1:8> have a logic "high" level during the read operation, the third comparison circuit 230 may generate the $17^{th}$ to $24^{th}$ bit signals HG_CON<17:24> of the up-control signal which are enabled. When all of the bits included in the first internal data ID1<1:8> have a logic "low" level during the read operation, the third comparison circuit 230 may generate the $17^{th}$ to $24^{th}$ bit signals LW_CON<17:24> of the down-control signal which are enabled. When all of the bits included in the first internal data ID1<1:8> do not have the same logic level during the read operation, the third comparison circuit 230 may generate the $17^{th}$ to $24^{th}$ bit signals BL_PRE<17:24> of the pre-burst control signal which are enabled. When all of the bits included in the first data DATA1<1:8> have a logic "high" level during the write operation, the third comparison circuit 230 may generate the $17^{th}$ to $24^{th}$ bit signals HG_CON<17:24> which are enabled. When all of the bits included in the first data DATA1<1:8> have a logic "low" level during the write operation, the third comparison circuit 230 may generate the $17^{th}$ to $24^{th}$ bit signals LW_CON<17:24> of the down-control signal which are enabled. When all of the bits included in the first data DATA1<1:8> do not have the same logic level during the write operation, the third comparison circuit 230 may generate the $17^{th}$ to $24^{th}$ bit signals BL_PRE<17:24> of the pre-burst control signal which are enabled.

During the read operation, the fourth comparison circuit 240 may compare the logic levels of the bits included in the first internal data ID1<1:8> to generate $25^{th}$ to $32^{nd}$ bit signals HG_CON<25:32> of the up-control signal, $25^{th}$ to $32^{nd}$ bit signals LW_CON<25:32> of the down-control signal, and $25^{th}$ to $32^{nd}$ bit signals BL_PRE<25:32> of the pre-burst control signal. During the write operation, the fourth comparison circuit 240 may compare the logic levels of the bits included in the first data DATA1<1:8> to generate the $25^{th}$ to $32^{nd}$ bit signals HG_CON<25:32> of the up-control signal, the $25^{th}$ to $32^{nd}$ bit signals LW_CON<25:32> of the down-control signal, and the $25^{th}$ to $32^{nd}$ bit signals BL_PRE<25:32> of the pre-burst control signal. When all of the bits included in the first internal data ID1<1:8> have a logic "high" level during the read operation, the fourth comparison circuit 240 may generate the $25^{th}$ to $32^{nd}$ bit signals HG_CON<25:32> of the up-control signal which are enabled. When all of the bits included in the first internal data ID1<1:8> have a logic "low" level during the read operation, the fourth comparison circuit 240 may generate the $25^{th}$ to $32^{nd}$ bit signals LW_CON<25:32> of the down-control signal which are enabled. When all of the bits included in the first internal data ID1<1:8> do not have the same logic level during the read operation, the fourth comparison circuit 240 may generate the $25^{th}$ to $32^{nd}$ bit signals BL_PRE<25:32> of the pre-burst control signal which are enabled. When all of the bits included in the first data DATA1<1:8> have a logic "high" level during the write operation, the fourth comparison circuit 240 may generate the $25^{th}$ to $32^{nd}$ bit signals HG_CON<25:32> of the up-control signal which are enabled. When all of the bits included in the first data DATA1<1:8> have a logic "low" level during the write operation, the fourth comparison circuit 240 may generate the $25^{th}$ to $32^{nd}$ bit signals LW_CON<25:32> of the down-control signal which are enabled. When all of the bits included in the first data DATA1<1:8> do not have the same logic level during the write operation, the fourth comparison circuit 240 may generate the $25^{th}$ to $32^{nd}$ bit signals BL_PRE<25:32> of the pre-burst control signal which are enabled.

During the read operation, the fifth comparison circuit 250 may compare the logic levels of the bits included in the first internal data ID1<1:8> to generate $33^{rd}$ to $40^{th}$ bit signals HG_CON<33:40> of the up-control signal, $33^{rd}$ to $40^{th}$ bit signals LW_CON<33:40> of the down-control signal, and $33^{rd}$ to $40^{th}$ bit signals BL_PRE<33:40> of the pre-burst control signal. During the write operation, the fifth comparison circuit 250 may compare the logic levels of the bits included in the first data DATA1<1:8> to generate the $33^{rd}$ to $40^{th}$ bit signals HG_CON<33:40> of the up-control signal, the $33^{rd}$ to $40^{th}$ bit signals LW_CON<33:40> of the down-control signal, and the $33^{rd}$ to $40^{th}$ bit signals BL_PRE<33:40> of the pre-burst control signal. When all of the bits included in the first internal data ID1<1:8> have a logic "high" level during the read operation, the fifth comparison circuit 250 may generate the $33^{rd}$ to $40^{th}$ bit signals HG_CON<33:40> of the up-control signal which are enabled. When all of the bits included in the first internal data ID1<1:8> have a logic "low" level during the read operation, the fifth comparison circuit 250 may generate the $33^{rd}$ to $40^{th}$ bit signals LW_CON<33:40> of the down-control signal which are enabled. When all of the bits included in the first internal data ID1<1:8> do not have the same logic level during the read operation, the fifth comparison circuit 250 may generate the $33^{rd}$ to $40^{th}$ bit signals BL_PRE<33:40> of the pre-burst control signal which are enabled. When all of the bits included in the first data DATA1<1:8> have a logic "high" level during the write operation, the fifth comparison circuit 250 may generate the $33^{rd}$ to $40^{th}$ bit signals HG_CON<33:40> of the up-control signal which are enabled. When all of the bits included in the first data DATA1<1:8> have a logic "low" level during the write operation, the fifth comparison circuit 250 may generate the $33^{rd}$ to $40^{th}$ bit signals LW_CON<33:40> of the down-control signal which are enabled. When all of the bits included in the first data DATA1<1:8> do not have the same logic level during the write operation, the fifth comparison circuit 250 may generate the $33^{rd}$ to $40^{th}$ bit signals BL_PRE<33:40> of the pre-burst control signal to which are enabled.

During the read operation, the sixth comparison circuit 260 may compare the logic levels of the bits included in the first internal data ID1<1:8> to generate $41^{st}$ to $48^{th}$ bit signals HG_CON<41:48> of the up-control signal, $41^{st}$ to $48^{th}$ bit signals LW_CON<41:48> of the down-control signal, and $41^{st}$ to $48^{th}$ bit signals BL_PRE<41:48> of the pre-burst control signal. During the write operation, the sixth comparison circuit 260 may compare the logic levels of the bits included in the first data DATA1<1:8> to generate the $41^{st}$ to $48^{th}$ bit signals HG_CON<41:48> of the up-control signal, the $41^{st}$ to $48^{th}$ bit signals LW_CON<41:48> of the down-control signal, and the $41^{st}$ to $48^{th}$ bit signals BL_PRE<41:48> of the pre-burst control signal. When all of the bits included in the first internal data ID1<1:8> have a logic "high" level during the read operation, the sixth comparison circuit 260 may generate the $41^{st}$ to $48^{th}$ bit signals HG_CON<41:48> of the up-control signal which are enabled. When all of the bits included in the first internal data ID1<1:8> have a logic "low" level during the read operation, the sixth comparison circuit 260 may generate the $41^{st}$ to $48^{th}$ bit signals LW_CON<41:48> of the down-control signal which are enabled. When all of the bits included in the first internal data ID1<1:8> do not have the same logic level during the read operation, the sixth comparison circuit 260 may generate the $41^{st}$ to $48^{th}$ bit signals BL_PRE<41:48> of the pre-burst control signal which are enabled. When all of the bits included in the first data DATA1<1:8> have a logic "high" level during the write operation, the sixth comparison circuit 260 may generate the $41^{st}$ to $48^{th}$ bit signals HG_CON<41:48> of the up-control signal which are enabled. When all of the bits included in the first data DATA1<1:8> have a logic "low" level during the write operation, the sixth comparison circuit 260 may generate the $41^{st}$ to $48^{th}$ bit signals LW_CON<41:48> of the down-control signal which are enabled. When all of the bits included in the first data DATA1<1:8> do not have the same logic level during the write operation, the sixth comparison circuit 260 may generate the $41^{st}$ to $48^{th}$ bit signals BL_PRE<41:48> of the pre-burst control signal which are enabled.

During the read operation, the seventh comparison circuit 270 may compare the logic levels of the bits included in the first internal data ID1<1:8> to generate $49^{th}$ to $56^{th}$ bit signals HG_CON<49:56> of the up-control signal, $49^{th}$ to $56^{th}$ bit signals LW_CON<49:56> of the down-control signal, and $49^{th}$ to $56^{th}$ bit signals BL_PRE<49:56> of the pre-burst control signal. During the write operation, the seventh comparison circuit 270 may compare the logic levels of the bits included in the first data DATA1<1:8> to generate the $49^{th}$ to $56^{th}$ bit signals HG_CON<49:56> of the up-control signal, the $49^{th}$ to $56^{th}$ bit signals LW_CON<49:56> of the down-control signal, and the $49^{th}$ to $56^{th}$ bit signals BL_PRE<49:56> of the pre-burst control signal. When all of the bits included in the first internal data ID1<1:8> have a logic "high" level during the read operation, the seventh comparison circuit 270 may generate the $49^{th}$ to $56^{th}$ bit signals HG_CON<49:56> of the up-control signal which are enabled. When all of the bits included in the first internal data ID1<1:8> have a logic "low" level during the read operation, the seventh comparison circuit 270 may generate the $49^{th}$ to $56^{th}$ bit signals LW_CON<49:56> of the down-control signal which are enabled. When all of the bits included in the first internal data ID1<1:8> do not have the same logic level during the read operation, the seventh comparison circuit 270 may generate the $49^{th}$ to $56^{th}$ bit signals BL_PRE<49:56> of the pre-burst control signal which are enabled. When all of the bits included in the first data DATA1<1:8> have a logic "high" level during the write operation, the seventh comparison circuit 270 may generate the $49^{th}$ to $56^{th}$ bit signals HG_CON<49:56> of the up-control signal which are enabled. When all of the bits included in the first data DATA1<1:8> have a logic "low" level during the write operation, the seventh comparison circuit 270 may generate the $49^{th}$ to $56^{th}$ bit signals LW_CON<49:56> of the down-control signal which are enabled. When all of the bits included in the first data DATA1<1:8> do not have the same logic level during the write operation, the seventh comparison circuit 270 may generate the $49^{th}$ to $56^{th}$ bit signals BL_PRE<49:56> of the pre-burst control signal which are enabled.

During the read operation, the eighth comparison circuit 280 may compare the logic levels of the bits included in the first internal data ID1<1:8> to generate $57^{th}$ to $64^{th}$ bit signals HG_CON<57:64> of the up-control signal, $57^{th}$ to $64^{th}$ bit signals LW_CON<57:64> of the down-control signal, and $57^{th}$ to $64^{th}$ bit signals BL_PRE<57:64> of the pre-burst control signal. During the write operation, the eighth comparison circuit 280 may compare the logic levels of the bits included in the first data DATA1<1:8> to generate the $57^{th}$ to $64^{th}$ bit signals HG_CON<57:64> of the up-control signal, the $57^{th}$ to $64^{th}$ bit signals LW_CON<57:64> of the down-control signal, and the $57^{th}$ to $64^{th}$ bit signals BL_PRE<57:64> of the pre-burst control signal. When all of the bits included in the first internal data ID1<1:8> have a logic "high" level during the read operation, the eighth comparison circuit 280 may generate the $57^{th}$ to $64^{th}$ bit signals HG_CON<57:64> of the up-control signal which are enabled. When all of the bits included in the first internal data ID1<1:8> have a logic "low" level during the read operation, the eighth comparison circuit 280 may generate the $57^{th}$ to $64^{th}$ bit signals LW_CON<57:64> of the down-control signal which are enabled. When all of the bits included in the first internal data ID1<1:8> do not have the same logic level during the read operation, the eighth comparison circuit 280 may generate the $57^{th}$ to $64^{th}$ bit signals BL_PRE<57:64> of the pre-burst control signal which are enabled. When all of the bits included in the first data DATA1<1:8> have a logic "high" level during the write operation, the eighth comparison circuit 280 may generate the 57$^{th}$ to 64$^{th}$ bit signals HG_CON<57:64> of the up-control signal which are enabled. When all of the bits included in the first data DATA1<1:8> have a logic "low" level during the write operation, the eighth comparison circuit 280 may generate the 57$^{th}$ to 64$^{th}$ bit signals LW_CON<57:64> of the down-control signal which are enabled. When all of the bits included in the first data DATA1<1:8> do not have the same logic level during the write operation, the eighth comparison circuit 280 may generate the 57$^{th}$ to 64$^{th}$ bit signals BL_PRE<57:64> of the pre-burst control signal which are enabled.

Figure 5:
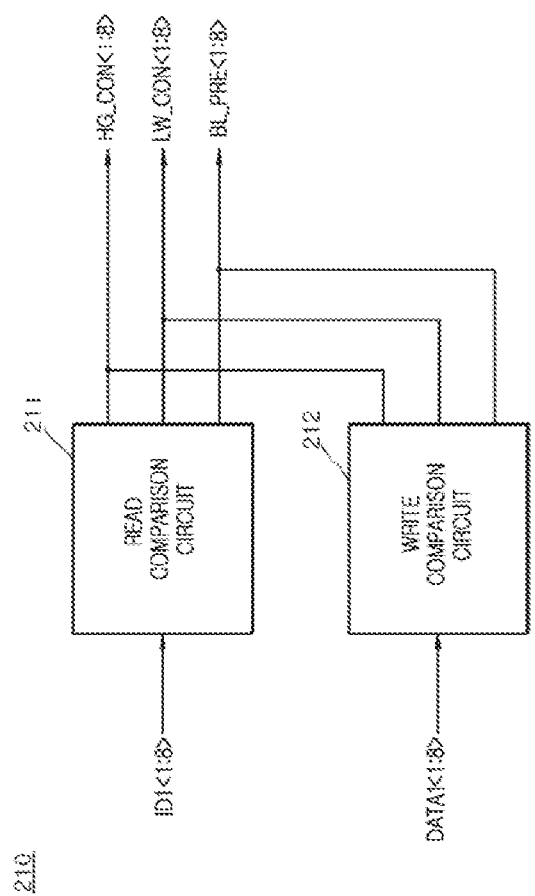
FIG. 5 is a block diagram illustrating a configuration of a first comparison circuit included in the data detection circuit illustrated in FIG. 4.

FIG. 5 is a block diagram illustrating a configuration of an example of the first comparison circuit 210. As illustrated in FIG. 5, the first comparison circuit 210 may include a read comparison circuit 211 and a write comparison circuit 212.

When all of the bits included in the first internal data ID1<1:8> have a logic "high" level during the read operation, the read comparison circuit 211 may generate the first to eighth bit signals HG_CON<1:8> of the up-control signal which are enabled. When all of the bits included in the first internal data ID1<1:8> have a logic "low" level during the read operation, the read comparison circuit 211 may generate the first to eighth bit signals LW_CON<1:8> of the down-control signal which are enabled. When all of the bits included in the first internal data ID1<1:8> do not have the same logic level during the read operation, the read comparison circuit 211 may generate the first to eighth bit signals BL_PRE<1:8> of the pre-burst control signal which are enabled.

When all of the bits included in the first data DATA1<1:8> have a logic "high" level during the write operation, the write comparison circuit 212 may generate the first to eighth bit signals HG_CON<1:8> of the up-control signal which are enabled. When all of the bits included in the first data DATA1<1:8> have a logic "low" level during the write operation, the write comparison circuit 212 may generate the first to eighth bit signals LW_CON<1:8> of the down-control signal which are enabled. When all of the bits included in the first data DATA1<1:8> do not have the same logic level during the write operation, the write comparison signal 212 may generate the first to eighth bit signals BL_PRE<1:8> of the pre-burst control signal which are enabled.

Meanwhile, each of the second to eighth comparison circuits 220 to 280 illustrated in FIG. 4 may be realized to have the same circuit as the first comparison circuit 210 illustrated in FIG. 5 except output signals thereof. Thus, detailed descriptions of the second to eighth comparison circuits 220 to 280 will be omitted hereinafter.

Figure 6:
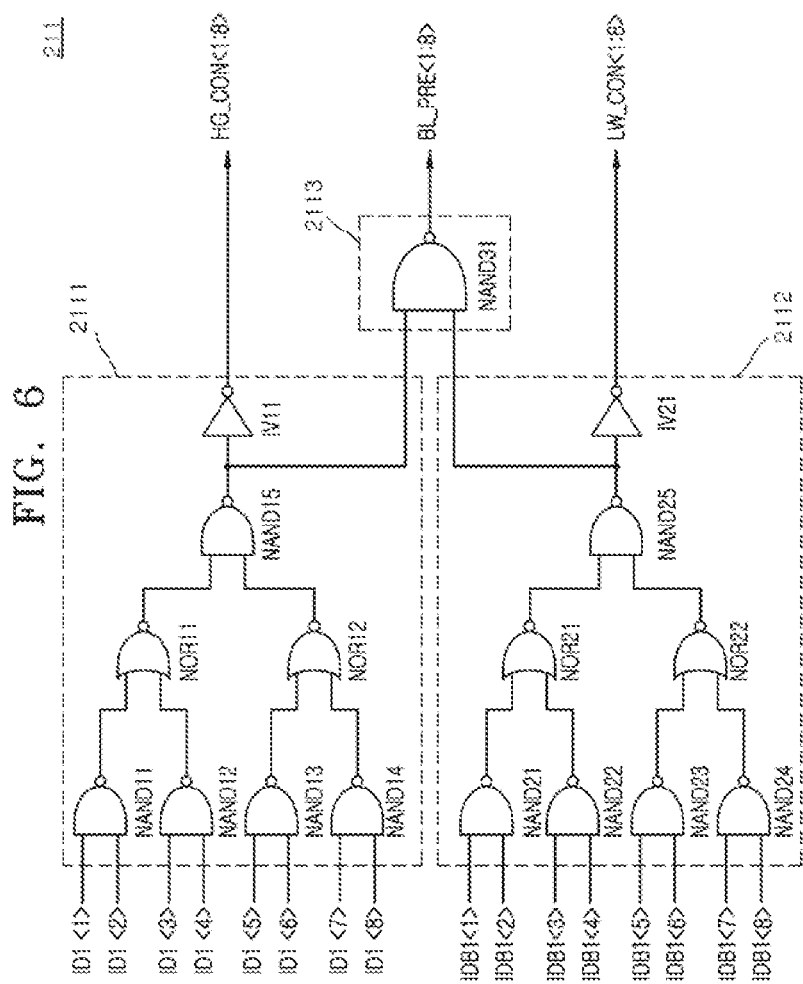
FIG. 6 is a circuit diagram illustrating a configuration of a read comparison circuit included in the first comparison circuit illustrated in FIG. 5.

FIG. 6 is a circuit diagram illustrating a configuration of an example of the read comparison circuit 211. As illustrated in FIG. 6, the read comparison circuit 211 may include a first logic circuit 2111, a second logic circuit 2112, and a third logic circuit 2113.

The first logic circuit 2111 may be realized using NAND gates NAND11, NAND12, NAND13, NAND14, and NAND15, NOR gates NOR11 and NOR12, and an inverter IV11. When all of the first to eighth bit signals ID1<1:8> of the first internal data have a logic "high" level, the first logic circuit 2111 may generate the first to eighth bit signals HG_CON<1:8> of the up-control signal which are enabled to have a logic "high" level. Although the first logic circuit 2111 is illustrated with one circuit, the first logic circuit 2111 may be configured to include eight circuits, the number of which is equal to the number of the first to eighth bit signals HG_CON<1:8> of the up-control signal.

The second logic circuit 2112 may be realized using NAND gates NAND21, NAND22, NAND23, NAND24, and NAND25, NOR gates NOR21 and NOR22, and an inverter IV21. When all of first to eighth bit signals IDB1<1:8> of first inverted internal data have a logic "high" level, the second logic circuit 2112 may generate the first to eighth bit signals LW_CON<1:8> of the down-control signal which are enabled to have a logic "high" level. Although the second logic circuit 2112 is illustrated with one circuit, the second logic circuit 2112 may be configured to include eight circuits, the number of which is equal to the number of the first to eighth bit signals LW_CON<1:8> of the down-control signal. The first to eighth bit signals IDB1<1:8> of the first inverted internal data may be obtained by inverting the first to eighth bit signals ID1<1:8> of the first internal data.

The third logic circuit 2113 may be realized using a NAND gate NAND31. When all of the first to eighth bit signals ID1<1:8> of the first internal data do not have the same logic level, the third logic circuit 2113 may generate the first to eighth bit signals BL_PRE<1:8> of the pre-burst control signal which are enabled to have a logic "low" level. Although the third logic circuit 2113 is illustrated with one circuit, the third logic circuit 2113 may be configured to include eight circuits, the number of which is equal to the number of the first to eighth bit signals BL_PRE<1:8> of the pre-burst control signal.

Figure 7:
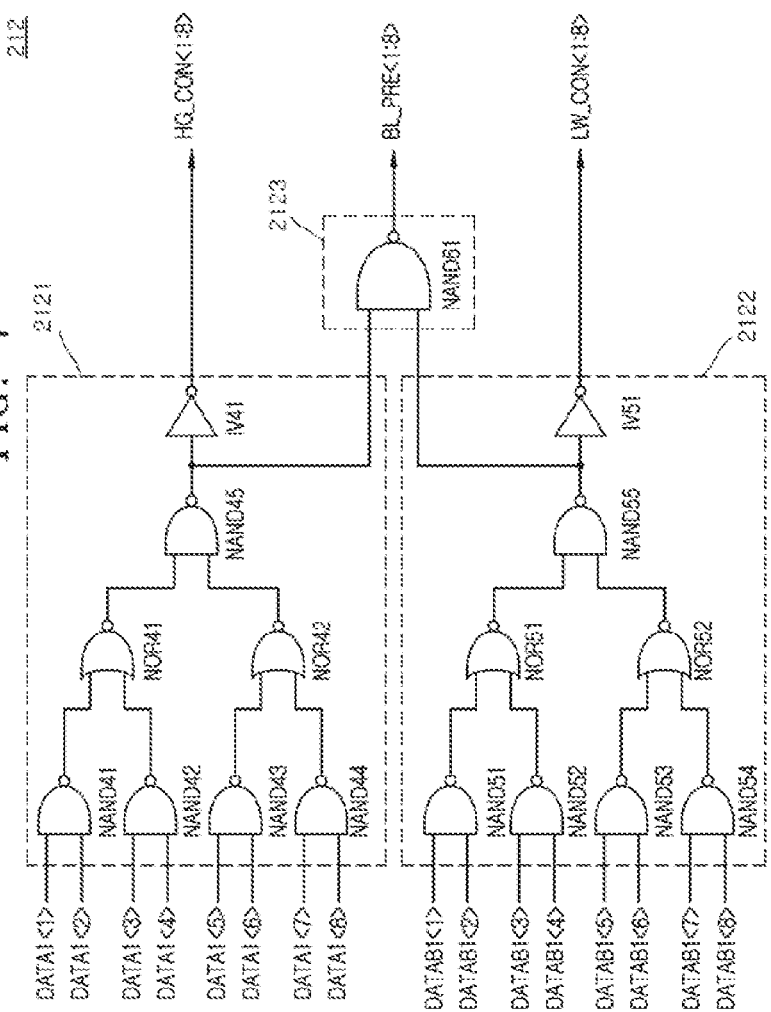
FIG. 7 is a circuit diagram illustrating a configuration of a write comparison circuit included in the first comparison circuit illustrated in FIG. 5.

FIG. 7 is a circuit diagram illustrating a configuration of an example of the write comparison circuit 212. As illustrated in FIG. 7, the write comparison circuit 212 may include a fourth logic circuit 2121, a fifth logic circuit 2122, and a sixth logic circuit 2123.

The fourth logic circuit 2121 may be realized using NAND gates NAND41, NAND42, NAND43, NAND44, and NAND45, NOR gates NOR41 and NOR42, and an inverter IV41. When all of the first to eighth bit signals DATA1<1:8> of the first data have a logic "high" level, the fourth logic circuit 2121 may generate the first to eighth bit signals HG_CON<1:8> of the up-control signal which are enabled to have a logic "high" level. Although the fourth logic circuit 2121 is illustrated with one circuit, the fourth logic circuit 2121 may be configured to include eight circuits, the number of which is equal to the number of the first to eighth bit signals HG_CON<1:8> of the up-control signal.

The fifth logic circuit 2122 may be realized using NAND gates NAND51, NAND52, NAND53, NAND54, and NAND55, NOR gates NOR51 and NOR52, and an inverter IV51. When all of first to eighth bit signals DATAB1<1:8> of first inverted data have a logic "high" level, the fifth logic circuit 2122 may generate the first to eighth bit signals LW_CON<1:8> of the down-control signal which are enabled to have a logic "high" level. Although the fifth logic circuit 2122 is illustrated with one circuit, the fifth logic circuit 2122 may be configured to include eight circuits, the number of which is equal to the number of the first to eighth bit signals LW_CON<1:8> of the down-control signal. The first to eighth bit signals DATAB1<1:8> of the first inverted data may be obtained by inverting the first to eighth bit signals DATA1<1:8> of the first data.

The sixth logic circuit 2123 may be realized using a NAND gate NAND61. When all of the first to eighth bit signals DATA1<1:8> of the first data do not have the same logic level, the sixth logic circuit 2123 may generate the first to eighth bit signals is BL_PRE<1:8> of the pre-burst control signal which are enabled to have a logic "low" level. Although the sixth logic circuit 2113 is illustrated with one circuit, the sixth logic circuit 2113 may be configured to include eight circuits, the number of which is equal to the number of bit signals BL_PRE<1:8> of the pre-burst control signal.

Figure 8:
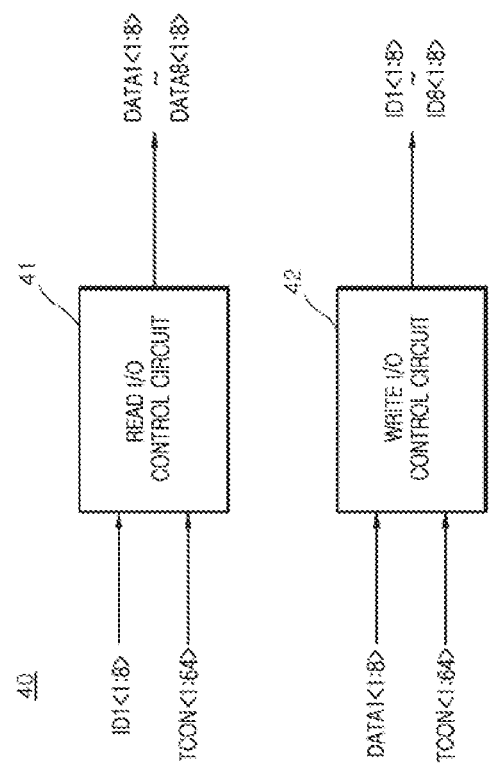
FIG. 8 is a block diagram illustrating a configuration of an input/output (I/O) control circuit included in the semiconductor device illustrated in FIG. 1.

FIG. 8 is a block diagram illustrating a configuration of an example of the I/O control circuit 40. As illustrated in FIG. 8, the I/O control circuit 40 may include a read I/O control circuit 41 and a write I/O control circuit 42.

During the read operation, the read I/O control circuit 41 may invert or non-invert logic levels of the first internal data ID1<1:8> based on the transfer control signal TCON<1:64> to generate the first to eighth data DATA1<1:8> to DATA8<1:8>.

During the write operation, the write I/O control circuit 42 may invert or non-invert logic levels of the first data DATA1<1:8> based on the transfer control signal TCON<1:64> to generate the first to eighth internal data ID1<1:8> to ID8<1:8>.

Figure 9:
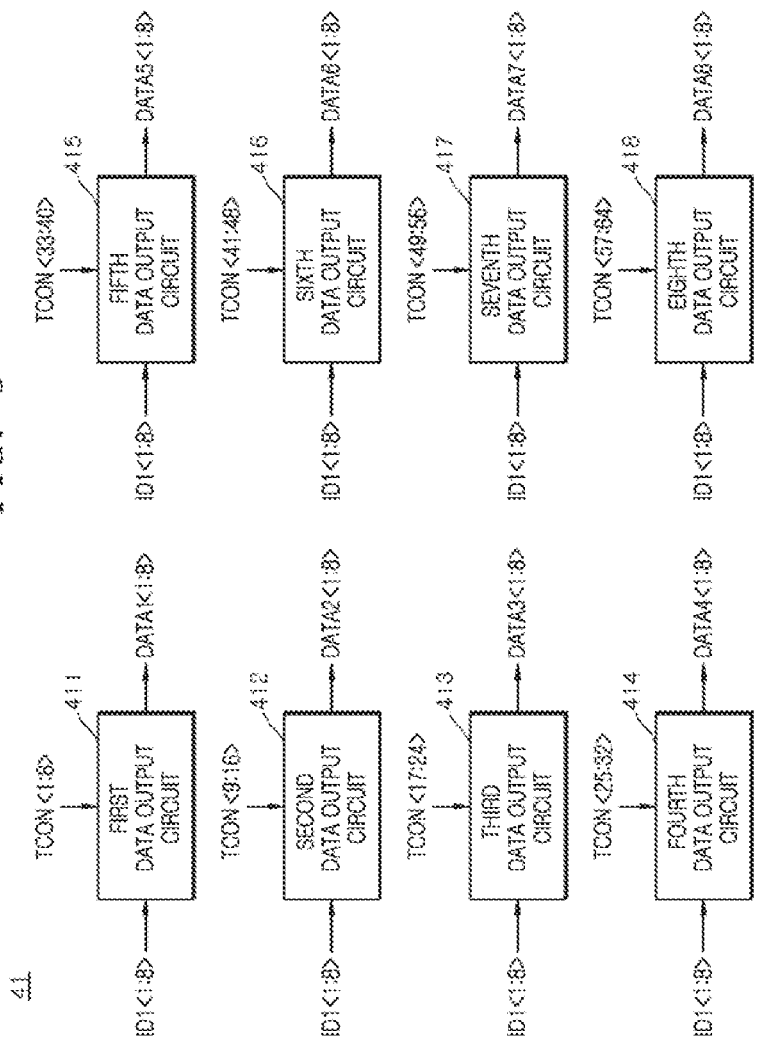
FIG. 9 is a block diagram illustrating a configuration of a read I/O control circuit included in the I/O control circuit illustrated in FIG. 8.

FIG. 9 is a block diagram illustrating a configuration of an example of the read I/O control circuit 41. As illustrated in FIG. 9, the read I/O control circuit 41 may include a first data output circuit 411, a second data output circuit 412, a third data output circuit 413, a fourth data output circuit 414, a fifth data output circuit 415, a sixth data output circuit 416, a seventh data output circuit 417, and an eighth data output circuit 418.

During the read operation, the first data output circuit 411 may buffer the first internal data ID1<1:8> based on the first to eighth bit signals TCON<1:8> of the transfer control signal to generate the first data DATA1<1:8>.

During the read operation, the second data output circuit 412 may invert or non-invert the first internal data ID1<1:8> based on the ninth to 16$^{th}$ bit signals TCON<9:16> of the transfer control signal to generate the second data DATA2<1:8>.

During the read operation, the third data output circuit 413 may invert or non-invert the first internal data ID1<1:8> based on the 17$^{th}$ to 24$^{th}$ bit signals TCON<17:24> of the transfer control signal to generate the third data DATA3<1:8>.

During the read operation, the fourth data output circuit 414 may invert or non-invert the first internal data ID1<1:8> based on the 25$^{th}$ to 32$^{nd}$ bit signals TCON<25:32> of the transfer control signal to generate the fourth data DATA4<1:8>.

During the read operation, the fifth data output circuit 415 may invert or non-invert the first internal data ID1<1:8> based on the 33$^{rd}$ to 40$^{th}$ bit signals TCON<33:40> of the transfer control signal to generate the fifth data DATA5<1:8>.

During the read operation, the sixth data output circuit 416 may invert or non-invert the first internal data ID1<1:8> based on the 41$^{st}$ to 48$^{th}$ bit signals TCON<41:48> of the transfer control signal to generate the sixth data DATA6<1:8>.

During the read operation, the seventh data output circuit 417 may invert or non-invert the first internal data ID1<1:8> based on the 49$^{th}$ to 56$^{th}$ bit signals TCON<49:56> of the transfer control signal to generate the seventh data DATA7<1:8>.

During the read operation, the eighth data output circuit 418 may invert or non-invert the first internal data ID1<1:8> based on the 57$^{th}$ to 64$^{th}$ bit signals TCON<57:64> of the transfer control signal to generate the eighth data DATA8<1:8>.

Figure 10:
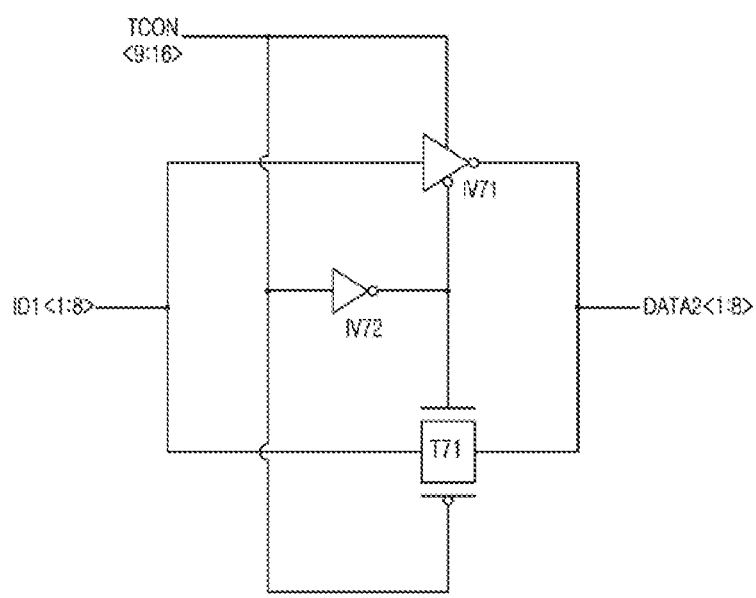
FIG. 10 is a circuit diagram illustrating a configuration of a second data output circuit included in the read I/O control circuit illustrated in FIG. 9.

FIG. 10 is a circuit diagram illustrating a configuration of an example of the second data output circuit 412. As illustrated in FIG. 10, the second data output circuit 412 may be realized using buffers IV71 and IV72 and a transfer gate T71.

When the ninth to 16$^{th}$ bit signals TCON<9:16> of the transfer control signal are enabled to have a logic "high" level, the buffer IV71 may invert the first to eighth bit signals ID1<1:8> of the first internal data to generate the first to eighth bit signals DATA2<1:8> of the second data.

When the ninth to 16$^{th}$ bit signals TCON<9:16> of the transfer control signal are disabled to have a logic "low" level, the transfer gate T71 may non-invert the first to eighth bit signals ID1<1:8> of the first internal data to generate the first to eighth bit signals DATA2<1:8> of the second data.

Meanwhile, the first data output circuit 411 illustrated in FIG. 9 may be realized using a transfer gate to generate the first data DATA1<1:8> by buffering the first internal data ID1<1:8>. In addition, each of the third to eighth data output circuits 413 to 418 illustrated in FIG. 9 may be configured to have the same circuit as the second data output circuit 412 illustrated in FIG. 10 except I/O signals thereof. Thus, descriptions of the third to eighth data output circuits 413 to 418 will be omitted hereinafter.

Figure 11:
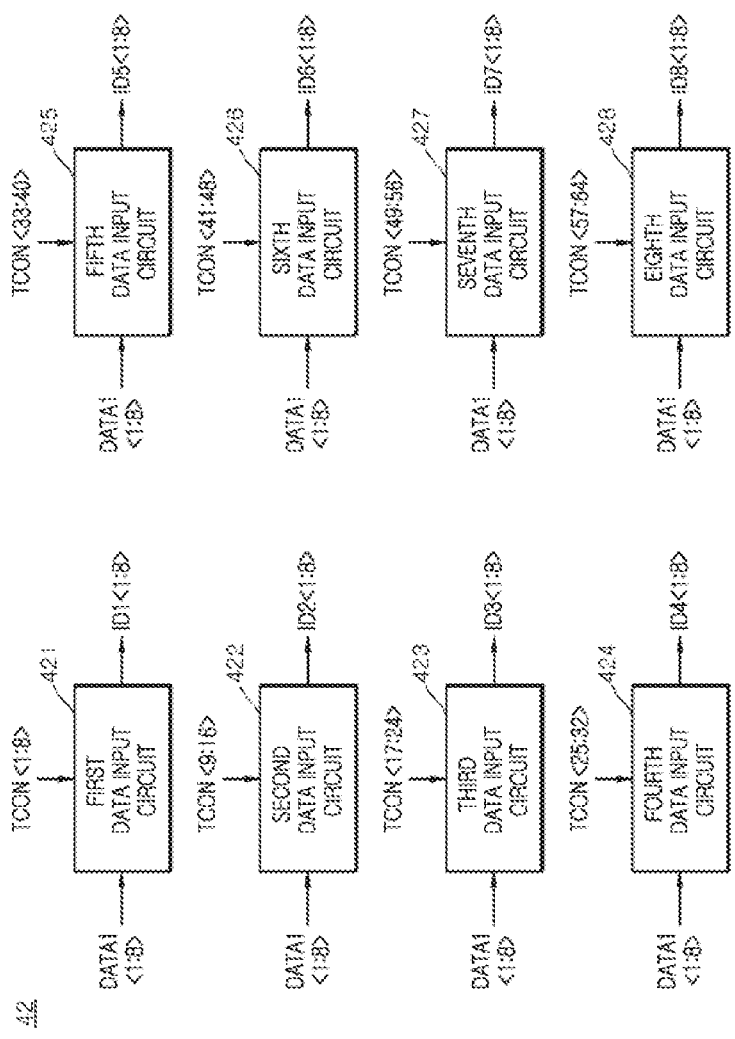
FIG. 11 is a block diagram illustrating a configuration of a write I/O control circuit included in the I/O control circuit illustrated in FIG. 8.

FIG. 11 is a block diagram illustrating a configuration of an example of the write I/O control circuit 42. As illustrated in FIG. 11, the write I/O control circuit 42 may include a first data input circuit 421, a second data input circuit 422, a third data input circuit 423, a fourth data input circuit 424, a fifth data input circuit 425, a sixth data input circuit 426, a seventh data input circuit 427, and an eighth data input circuit 428.

During the write operation, the first data input circuit 421 may buffer the first data DATA1<1:8> based on the first to eighth bit signals TCON<1:8> of the transfer control signal to generate the first internal data ID1<1:8>.

During the write operation, the second data input circuit 422 may invert or non-invert the first data DATA1<1:8> based on the ninth to 16$^{th}$ bit signals TCON<9:16> of the transfer control signal to generate the second internal data ID2<1:8>.

During the write operation, the third data input circuit 423 may invert or non-invert the first data DATA1<1:8> based on the 17$^{th}$ to 24$^{th}$ bit signals TCON<17:24> of the transfer control signal to generate the third internal data ID3<1:8>.

During the write operation, the fourth data input circuit 424 may invert or non-invert the first data DATA1<1:8> based on the 25$^{th}$ to 32$^{nd}$ bit signals TCON<25:32> of the transfer control signal to generate the fourth internal data ID4<1:8>.

During the write operation, the fifth data input circuit 425 may invert or non-invert the first data DATA1<1:8> based on the 33$^{rd}$ to 40$^{th}$ bit signals TCON<33:40> of the transfer control signal to generate the fifth internal data ID5<1:8>.

During the write operation, the sixth data input circuit 426 may invert or non-invert the first data DATA1<1:8> based on the 41$^{st}$ to 48$^{th}$ bit signals TCON<41:48> of the transfer control signal to generate the sixth internal data ID6<1:8>.

During the write operation, the seventh data input circuit 427 may invert or non-invert the first data DATA1<1:8> based on the 49$^{th}$ to 56$^{th}$ bit signals TCON<49:56> of the transfer control signal to generate the seventh internal data ID7<1:8>.

During the write operation, the eighth data input circuit 428 may invert or non-invert the first data DATA1<1:8> based on the 57th to 64th bit signals TCON<57:64> of the transfer control signal to generate the eighth internal data ID8<1:8>.

Figure 12:
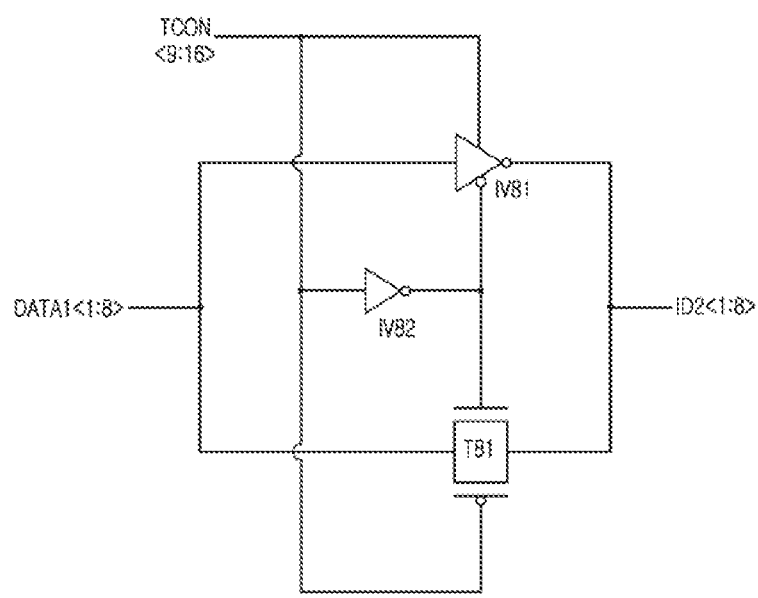
FIG. 12 is a circuit diagram illustrating a configuration of a second data input circuit included in the write I/O control circuit illustrated in FIG. 11.

FIG. 12 is a circuit diagram illustrating a configuration of an example of the second data input circuit 422. As illustrated in FIG. 12, the second data input circuit 422 may include buffers IV81 and IV82 and a transfer gate T81.

When the ninth to 16th bit signals TCON<9:16> of the transfer control signal are enabled to have a logic "high" level, the buffer IV81 may invert the first to eighth bit signals DATA1<1:8> of the first data to generate the first to eighth bit signals ID2<1:8> of the second internal data.

When the ninth to 16th bit signals TCON<9:16> of the transfer control signal are disabled to have a logic "low" level, the transfer gate T81 may non-invert the first to eighth bit signals DATA1<1:8> of the first data to generate the first to eighth bit signals ID2<1:8> of the second internal data.

Meanwhile, the first data input circuit 421 illustrated in FIG. 11 may be realized using a transfer gate to generate the first internal data ID1<1:8> by buffering the first data DATA1<1:8>. In addition, each of the third to eighth data input circuits 423 to 428 illustrated in FIG. 11 may be configured to have the same circuit as the second data input circuit 422 illustrated in FIG. 12 except I/O signals thereof. Thus, descriptions the third to eighth data input circuits 423 to 428 will be omitted hereinafter.

Figure 13:
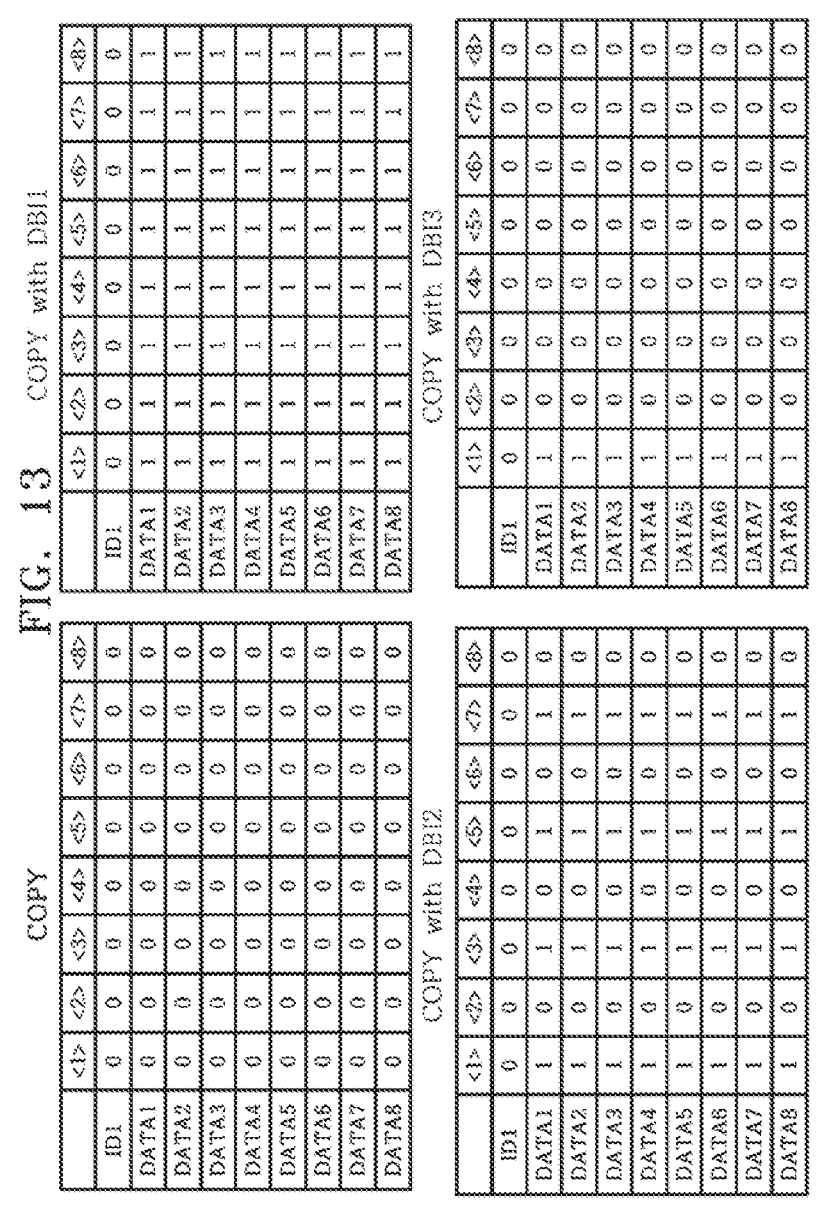

The copy operation and the data inversion operation of a semiconductor device according to an embodiment of the present disclosure will be described hereinafter with reference to FIGS. 13 and 14 in conjunction with a case that the first internal data ID1<1:8> are copied to generate the first to eighth data DATA1<1:8> to DATA8<1:8>.

An operation of copying the first internal data ID1<1:8> of "00000000" during a copy operation COPY will be described hereinafter with reference to FIG. 13.

The first data DATA1<1:8> may be generated to have binary data of "00000000" by copying the first internal data ID1<1:8> of "00000000", the second data DATA2<1:8> may be generated to have binary data of "00000000" by copying the first internal data ID1<1:8> of "00000000", the third data DATA3<1:8> may be generated to have binary data of "00000000" by copying the first internal data ID1<1:8> of "00000000", the fourth data DATA4<1:8> may be generated to have binary data of "00000000" by copying the first internal data ID1<1:8> of "00000000", the fifth data DATA5<1:8> may be generated to have binary data of "00000000" by copying the first internal data ID1<1:8> of "00000000", the sixth data DATA6<1:8> may be generated to have binary data of "00000000" by copying the first internal data ID1<1:8> of "00000000", the seventh data DATA7<1:8> may be generated to have binary data of "00000000" by copying the first internal data ID1<1:8> of "00000000", and the eighth data DATA8<1:8> may be generated to have binary data of "00000000" by copying the first internal data ID1<1:8> of "00000000".

The operation of copying the first internal data ID1<1:8> of "00000000" in a first case (COPY with DBI1) performing the data inversion operation during the copy operation will be described hereinafter with reference to FIG. 13. The first case performing the data inversion operation during the copy operation may be set as an operation that generates the first to eighth data DATA1<1:8> to DATA8<1:8> by inverting the first internal data ID1<1:8>.

The first data DATA1<1:8> may be generated to have binary data of "11111111" by inverting the first internal data ID1<1:8> of "00000000", the second data DATA2<1:8> may be generated to have binary data of "11111111" by inverting the first internal data ID1<1:8> of "00000000", the third data DATA3<1:8> may be generated to have binary data of "11111111" by inverting the first internal data ID1<1:8> of "00000000", the fourth data DATA4<1:8> may be generated to have binary data of "11111111" by inverting the first internal data ID1<1:8> of "00000000", the fifth data DATA5<1:8> may be generated to have binary data of "11111111" by inverting the first internal data ID1<1:8> of "00000000", the sixth data DATA6<1:8> may be generated to have binary data of "11111111" by inverting the first internal data ID1<1:8> of "00000000", the seventh data DATA7<1:8> may be generated to have binary data of "11111111" by inverting the first internal data ID1<1:8> of "00000000", and the eighth data DATA8<1:8> may be generated to have binary data of "11111111" by inverting the first internal data ID1<1:8> of "00000000".

The operation of copying the first internal data ID1<1:8> of "00000000" in a second case (COPY with DBI2) performing the data inversion operation during the copy operation will be described hereinafter with reference to FIG. 13. The second case performing the data inversion operation during the copy operation may be set as an operation that generates the first to eighth data DATA1<1:8> to DATA8<1:8> by inverting odd bits ID1<1>, ID1<3>, ID1<5> and ID1<7> of the first internal data ID1<1:8>.

The first data DATA1<1:8> may be generated to have binary data of "10101010" by inverting odd bits of the first internal data ID1<1:8> of "00000000", the second data DATA2<1:8> may be generated to have binary data of "10101010" by inverting odd bits of the first internal data ID1<1:8> of "00000000", the third data DATA3<1:8> may be generated to have binary data of "10101010" by inverting odd bits of the first internal data ID1<1:8> of "00000000", the fourth data DATA4<1:8> may be generated to have binary data of "10101010" by inverting odd bits of the first internal data ID1<1:8> of "00000000", the fifth data DATA5<1:8> may be generated to have binary data of "10101010" by inverting odd bits of the first internal data ID1<1:8> of "00000000", the sixth data DATA6<1:8> may be generated to have binary data of "10101010" by inverting odd bits of the first internal data ID1<1:8> of "00000000", the seventh data DATA7<1:8> may be generated to have binary data of "10101010" by inverting odd bits of the first internal data ID1<1:8> of "00000000", and the eighth data DATA8<1:8> may be generated to have binary data of "10101010" by inverting odd bits of the first internal data ID1<1:8> of "00000000".

The operation of copying the first internal data ID1<1:8> of "00000000" in a third case (COPY with DBI3) performing the data inversion operation during the copy operation will be described hereinafter with reference to FIG. 13. The third case performing the data inversion operation during the copy operation may be set as an operation that generates the first to eighth data DATA1<1:8> to DATA8<1:8> by inverting a first bit ID1<1> of the first internal data ID1<1:8>.

The first data DATA1<1:8> may be generated to have binary data of "10000000" by inverting the first bit of the first internal data ID1<1:8> of "00000000", the second data DATA2<1:8> may be generated to have binary data of "10000000" by inverting the first bit of the first internal data ID1<1:8> of "00000000", the third data DATA3<1:8> may be generated to have binary data of "10000000" by inverting the first bit of the first internal data ID1<1:8> of "00000000", the fourth data DATA4<1:8> may be generated to have binary data of "10000000" by inverting the first bit of the first internal data ID1<1:8> of "00000000", the fifth data DATA5<1:8> may be generated to have binary data of "10000000" by inverting the first bit of the first internal data ID1<1:8> of "00000000", the sixth data DATA6<1:8> may be generated to have binary data of "10000000" by inverting the first bit of the first internal data ID1<1:8> of "00000000", the seventh data DATA7<1:8> may be generated to have binary data of "10000000" by inverting the first bit of the first internal data ID1<1:8> of "00000000", and the eighth data DATA8<1:8> may be generated to have binary data of "10000000" by inverting the first bit of the first internal data ID1<1:8> of "00000000".

An operation of copying the first internal data ID1<1:8> of "10101010" in the copy operation COPY will be described hereinafter with reference to FIG. 14.

The first data DATA1<1:8> may be generated to have binary data of "10101010" by copying the first internal data ID1<1:8> of "10101010", the second data DATA2<1:8> may be generated to have binary data of "10101010" by copying the first internal data ID1<1:8> of "10101010", the third data DATA3<1:8> may be generated to have binary data of "10101010" by copying the first internal data ID1<1:8> of "10101010", the fourth data DATA4<1:8> may be generated to have binary data of "10101010" by copying the first internal data ID1<1:8> of "10101010", the fifth data DATA5<1:8> may be generated to have binary data of "10101010" by copying the first internal data ID1<1:8> of "10101010", the sixth data DATA6<1:8> may be generated to have binary data of "10101010" by copying the first internal data ID1<1:8> of "10101010", the seventh data DATA7<1:8> may be generated to have binary data of "10101010" by copying the first internal data ID1<1:8> of "10101010", and the eighth data DATA8<1:8> may be generated to have binary data of "10101010" by copying the first internal data ID1<1:8> of "10101010".

The operation of copying the first internal data ID1<1:8> of "10101010" in a first case (COPY with DBI1) performing the data inversion operation during the copy operation will be described hereinafter with reference to FIG. 14. The first case performing the data inversion operation during the copy operation may be set as an operation that generates the first to eighth data DATA1<1:8> to DATA8<1:8> by inverting the first internal data ID1<1:8>.

The first data DATA1<1:8> may be generated to have binary data of "01010101" by inverting the first internal data ID1<1:8> of "10101010", the second data DATA2<1:8> may be generated to have binary data of "01010101" by inverting the first internal data ID1<1:8> of "10101010", the third data DATA3<1:8> may be generated to have binary data of "01010101" by inverting the first internal data ID1<1:8> of "10101010", the fourth data DATA4<1:8> may be generated to have binary data of "01010101" by inverting the first internal data ID1<1:8> of "10101010", the fifth data DATA5<1:8> may be generated to have binary data of "01010101" by inverting the first internal data ID1<1:8> of "10101010", the sixth data DATA6<1:8> may be generated to have binary data of "01010101" by inverting the first internal data ID1<1:8> of "10101010", the seventh data DATA7<1:8> may be generated to have binary data of "01010101" by inverting the first internal data ID1<1:8> of "10101010", and the eighth data DATA8<1:8> may be generated to have binary data of "01010101" by inverting the first internal data ID1<1:8> of "10101010".

The operation of copying the first internal data ID1<1:8> of "10101010" in a second case (COPY with DBI2) performing the data inversion operation during the copy operation will be described hereinafter with reference to FIG. 14. The second case performing the data inversion operation during the copy operation may be set as an operation that generates the first to eighth data DATA1<1:8> to DATA8<1:8> by inverting odd bits ID1<1>, ID1<3>, ID1<5>, and ID1<7> of the first internal data ID1<1:8>.

The first data DATA1<1:8> may be generated to have binary data of "00000000" by inverting odd bits of the first internal data ID1<1:8> of "10101010", the second data DATA2<1:8> may be generated to have binary data of "00000000" by inverting odd bits of the first internal data ID1<1:8> of "10101010", the third data DATA3<1:8> may be generated to have binary data of "00000000" by inverting odd bits of the first internal data ID1<1:8> of "10101010", the fourth data DATA4<1:8> may be generated to have binary data of "00000000" by inverting odd bits of the first internal data ID1<1:8> of "10101010", the fifth data DATA5<1:8> may be generated to have binary data of "00000000" by inverting odd bits of the first internal data ID1<1:8> of "10101010", the sixth data DATA6<1:8> may be generated to have binary data of "00000000" by inverting odd bits of the first internal data ID1<1:8> of "10101010", the seventh data DATA7<1:8> may be generated to have binary data of "00000000" by inverting odd bits of the first internal data ID1<1:8> of "10101010", and the eighth data DATA8<1:8> may be generated to have binary data of "00000000" by inverting odd bits of the first internal data ID1<1:8> of "10101010".

The operation of copying the first internal data ID1<1:8> of "10101010" in a third case (COPY with DBI3) performing the data inversion operation during the copy operation will be described hereinafter with reference to FIG. 14. The second case performing the data inversion operation during the copy operation may be set as an operation that generates the first to eighth data DATA1<1:8> to DATA8<1:8> by inverting a first bit ID1<1> of the first internal data ID1<1:8>.

The first data DATA1<1:8> may be generated to have binary data of "00101010" by inverting the first bit of the first internal data ID1<1:8> of "10101010", the second data DATA2<1:8> may be generated to have binary data of "00101010" by inverting the first bit of the first internal data ID1<1:8> of "10101010", the third data DATA3<1:8> may be generated to have binary data of "00101010" by inverting the first bit of the first internal data ID1<1:8> of "10101010", the fourth data DATA4<1:8> may be generated to have binary data of "00101010" by inverting the first bit of the first internal data ID1<1:8> of "10101010", the fifth data DATA5<1:8> may be generated to have binary data of "00101010" by inverting the first bit of the first internal data ID1<1:8> of "10101010", the sixth data DATA6<1:8> may be generated to have binary data of "00101010" by inverting the first bit of the first internal data ID1<1:8> of "10101010", the seventh data DATA7<1:8> may be generated to have binary data of "00101010" by inverting the first bit of the first internal data ID1<1:8> of "10101010", and the eighth data DATA8<1:8> may be generated to have binary data of "00101010" by inverting the first bit of the first internal data ID1<1:8> of "10101010".

As described above, a semiconductor device according to an embodiment of the present disclosure may copy a set of data to generate multiple sets of data when a copy operation is performed. Because the semiconductor device copies a set of data to generate multiple sets of data during the copy operation, no additional circuit for generating the multiple sets of data is required. Thus, it may possible to reduce a layout area of the semiconductor device. Moreover, the semiconductor device may selectively perform a data inversion operation during the copy operation to generate diverse data having various patterns.

Figure 15:
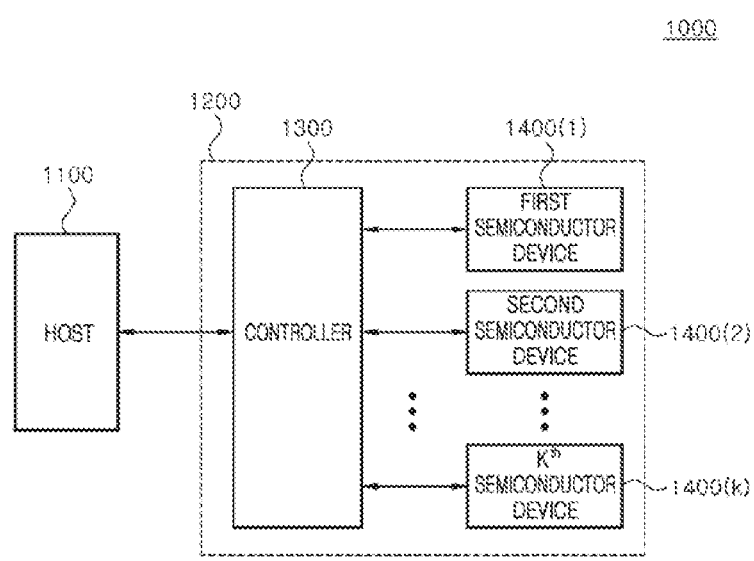
FIG. 15 is a block diagram illustrating a configuration of an electronic system employing the semiconductor device illustrated in FIGS. 1 to 14.

FIG. 15 is a block diagram illustrating a configuration of an example of an electronic system 1000 according to an embodiment of the present disclosure. As illustrated in FIG. 15, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform the copy operation, the data inversion operation, the read operation, and the write operation. Each of the semiconductor devices 1400(K:1) may copy a set of data to generate multiple sets of data. Because each of the semiconductor devices copies a set of data to generate multiple sets of data during the copy operation, no additional circuit for generating the multiple sets of data is required. Thus, it may possible to reduce a layout area of the semiconductor devices. In addition, each of the the semiconductor devices may selectively perform the data inversion operation during the copy operation to generate diverse data having various patterns.

Each of the semiconductor devices 1400(K:1) may be realized using the semiconductor device 1 illustrated in FIG. 1. In some embodiments, each of the semiconductor devices 1400(K:1) may be realized using any one of a dynamic random access memory (DRAM), a phase change random access memory (PRAM), a resistive random access memory (RRAM), a magnetic random access memory (MRAM), and a ferroelectric random access memory (FRAM).

What is claimed is:

1. A semiconductor device comprising:
a control signal generation circuit configured to enter a copy operation based on a combination of logic levels of first and second operation control signals and configured to generate a transfer control signal according to a detection result of logic levels of bits included in first internal data during the copy operation; and
an input/output (input and output) control circuit configured to generate first data and second data by performing at least one of inverting and non-inverting the logic levels of the first internal data based on the transfer control signal.

2. The semiconductor device of claim 1, wherein the first operation control signal is enabled to enter the copy operation, and the second operation control signal is enabled to perform a data inversion operation for inverting logic levels of the first internal data during the copy operation.

3. The semiconductor device of claim 1, wherein bits included in the first data are generated to have the same logic levels as bits included in the first internal data, and bits included in the second data are generated by performing at least one of inverting and non-inverting the logic levels of the bits included in the first internal data.

4. The semiconductor device of claim 1, wherein the number of bits of the transfer control signal is set to be equal to a sum of the number of bits included in the first and second internal data.

5. The semiconductor device of claim 1, wherein the control signal generation circuit includes:
a data detection circuit configured to detect logic levels of the bits included in the first internal data to generate an up-control signal, a down-control signal, and a pre-burst control signal;
a burst control signal generation circuit configured to generate a burst control signal from the pre-burst control signal based on a combination of logic levels of the first and second operation control signals; and
a transfer control signal generation circuit configured to generate the transfer control signal based on logic levels of the up-control signal, the down-control signal, and the burst control signal.

6. The semiconductor device of claim 5,
wherein the up-control signal is enabled when all of the bits included in the first internal data have a first logic level;
wherein the down-control signal is enabled when all of the bits included in the first internal data have a second logic level; and
wherein the pre-burst control signal is enabled when a logic level of at least one of the bits included in the first internal data is different from a logic level of the remaining bits of the bits included in the first internal data.

7. The semiconductor device of claim 1, wherein the input/output control circuit includes:
a first data output circuit configured to buffer the first internal data based on the transfer control signal to generate the first data; and
a second data output circuit configured to perform at least one of inverting and non-inverting the first internal data based on the transfer control signal to generate the second data.

8. The semiconductor device of claim 7, wherein the second data output circuit includes:
a buffer configured to invert the first internal data based on the transfer control signal to output the inverted first data as the second data; and
a transfer gate configured to non-invert the first internal data based on the transfer control signal to output the first internal data as the second data.

9. A semiconductor device comprising:
a control signal generation circuit configured to generate a transfer control signal according to a detection result of logic levels of bits included in first internal data and first data during a copy operation;
a core circuit configured to output the first internal data stored in the core circuit based on a read command and an address during a read operation and configured to store the first internal data and second internal data based on a write command and the address during a write operation; and
an input/output (input and output) control circuit configured to perform at least one of an inversion and non-inversion of logic levels of the first internal data based on the transfer control signal to generate the first data and second data during the read operation and configured to perform at least one of an inversion and non-inversion of logic levels of the first data based on the transfer control signal during the write operation to generate the first internal data and the second internal data during the write operation.

10. The semiconductor device of claim 9, wherein the copy operation is an operation for generating the first and second data by copying the first internal data during the read operation and for generating the first and second internal data by copying the first data during the write operation.

11. The semiconductor device of claim 9,
wherein the bit signals of the first data are generated to have the same logic levels as the bit signals of the first internal data during the read operation; and
wherein the bit signals of the second data are generated by performing at least one of inverting and non-inverting the logic levels of the bit signals of the first internal data during the read operation.

12. The semiconductor device of claim 9,
wherein the bit signals of the first internal data are generated to have the same logic levels as the bit signals of the first data during the write operation; and
wherein the bit signals of the second internal data are generated by performing at least one of inverting and non-inverting logic levels of the bit signals of the first data during the write operation.

13. The semiconductor device of claim 9,
wherein the number of bits of the transfer control signal is set to be equal to a sum of the number of bits included in the first and second internal data; and
wherein the number of bits of the transfer control signal is set to be equal to a sum of the number of bits included in the first and second data.

14. The semiconductor device of claim 9, wherein the control signal generation circuit includes:
a data detection circuit configured to detect logic levels of the bit signals included in the first internal data to generate an up-control signal, a down-control signal, and a pre-burst control signal during the read operation and configured to detect logic levels of the bit signals included in the first data to generate the up-control signal, the down-control signal, and the pre-burst control signal during the write operation;
a burst control signal generation circuit configured to generate a burst control signal from the pre-burst control signal based on a combination of logic levels of first and second operation control signals; and
a transfer control signal generation circuit configured to generate the transfer control signal based on logic levels of the up-control signal, the down-control signal, and the burst control signal.

15. The semiconductor device of claim 14,
wherein the up-control signal is enabled when all of the bits included in the first internal data and the first data have a first logic level;
wherein the down-control signal is enabled when all of the bits included in the first internal data and the first data have a second logic level; and
wherein the pre-burst control signal is enabled when a logic level of at least one of the bits included in the first internal data or the first data is different from a logic level of the remaining bits of the bits included in the first internal data or the first data.

16. The semiconductor device of claim 9, wherein the input/output control circuit includes:
a read input/output control circuit configured to generate the first data and the second data by performing at least one of inverting and non-inverting the logic levels of the first internal data based on the transfer control signal during the read operation; and
a write input/output control circuit configured to generate the first internal data and the second internal data by performing at least one of inverting and non-inverting the logic levels of the first data based on the transfer control signal during the write operation.

17. The semiconductor device of claim 16, wherein the read input/output control circuit includes:
a first data output circuit configured to generate the first data by buffering the first internal data based on the transfer control signal; and
a second data output circuit configured to generate the second data by performing at least one of an inversion and non-inversion of the first internal data based on the transfer control signal.

18. The semiconductor device of claim 17, wherein the second data output circuit includes:
a first buffer configured to invert the first internal data based on the transfer control signal to output the inverted first internal data as the second data; and
a first transfer gate configured to non-invert the first internal data based on the transfer control signal to output the non-inverted first internal data as the second data.

19. The semiconductor device of claim 16, wherein the write input/output control circuit includes:
a first data input circuit configured to generate the first internal data by buffering the first data based on the transfer control signal; and
a second data input circuit configured to generate the second internal data by performing at least one of an inversion and non-inversion of the first data based on the transfer control signal.

20. The semiconductor device of claim 19, wherein the second data input circuit includes:
a second buffer configured to invert the first data based on the transfer control signal to output the inverted first data as the second internal data; and
a second transfer gate configured to non-invert the first data based on the transfer control signal to output the non-inverted first data as the second internal data.

\* \* \* \* \*